US006603418B2

(12) United States Patent
Al-Awadhi

(10) Patent No.: US 6,603,418 B2
(45) Date of Patent: Aug. 5, 2003

(54) HIGH PRECISION, HIGH-SPEED SIGNAL SOURCE

(75) Inventor: Ayman A. Al-Awadhi, Brookline, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/017,690

(22) Filed: Dec. 14, 2001

(65) Prior Publication Data

US 2003/0112166 A1 Jun. 19, 2003

(51) Int. Cl.[7] .............................................. H03M 1/66
(52) U.S. Cl. ...................................................... 341/144
(58) Field of Search ................................ 341/144, 145, 341/154

(56) References Cited

U.S. PATENT DOCUMENTS

| 4,131,885 A | | 12/1978 | Ninomaya | 340/347 |
|---|---|---|---|---|
| 5,150,120 A | | 9/1992 | Yunus | 341/143 |
| 5,196,852 A | | 3/1993 | Galton | 341/143 |
| 5,896,100 A | | 4/1999 | Panaoussis | 341/108 |
| 6,037,889 A | * | 3/2000 | Knee | 341/144 |
| 6,195,031 B1 | | 2/2001 | Feld | 341/159 |
| 6,195,032 B1 | | 2/2001 | Watson | 341/162 |

OTHER PUBLICATIONS

Cascaded parallel oversampling sigma–delta modulators Xuesheng Wang; Wei Qin; Xieting Ling Circuits and Systems II: Analog and Digital Signal Processing, IEEE Transactions on, vol.: 47 Issue: 2, Feb. 2000, pp.: 156–161.

Oversampling parallel delta–sigma modulator A/D conversion Galton I.; Jensen, H.T. Circuits and Systems II: Analog and Digital Signal Processing, IEEE Transactions on, vol.: 43 Issue: 12, Dec. 1996, pp.: 801–810.

Effects of quantization noise in parallel arrays of analog-–to–digital converters Petraglia, A.; Pinheiro, M.A.A. Circuits and Systems, 1994. ISCAS '94., 1994 IEEE International Symposium on, vol.: 5, 1994, pp.: 337–340 vol. 5.

U.S. patent application Ser. No. 09/645,367, Sheen, filed Aug. 24, 2000.

U.S. patent application Ser. No. 09/960,173, Sheen, filed Sep. 21, 2001.

* cited by examiner

Primary Examiner—Brian Young
(74) Attorney, Agent, or Firm—Bruce D. Rubenstein

(57) ABSTRACT

A topology for converting a digital input signal into a corresponding analog output signal provides both high speed and high precision. The topology includes a plurality of substantially identical DAC stages, each having lower resolution than the digital input signal. The DAC stages each preferably include a multi-bit sigma-delta loop, which enhances precision through inherent noise shaping. Bits of the digital input signal are distributed to different DAC stages, and at least one bit of the digital input signal is coupled to greater than one DAC stage. A combining circuit is coupled to the output of each DAC stage for generating the analog output signal.

21 Claims, 2 Drawing Sheets

HIGH PRECISION, HIGH-SPEED SIGNAL SOURCE

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND OF THE INVENTION

1. Field of the Invention

This invention relates generally to circuits for converting electrical signals from digital to analog form, and, more particularly, to applying these circuits in source instruments for use in automatic test equipment.

2. Description of Related Art Including Information Disclosed Under 37 C.F.R. 1.97 and 1.98

Sourcing analog signals is a basic function of automatic test equipment for electronics (ATE). An analog source converts a sequence of digital values into corresponding analog levels, using a circuit conventionally known as a Digital-to-Analog converter, or DAC. As faster and more accurate electronic devices come to market, test systems must be equipped with faster and more accurate DAC's if test systems are to keep pace with advances in new devices. A difficulty arises in the design of ATE, however, because converters that are extremely fast tend to be relatively inaccurate, and converters that are extremely accurate tend to be relatively slow. To promote flexibility for testing a wide range of device characteristics, ATE developers seek to provide both high speed and high accuracy in a single converter topology.

ATE developers have long recognized that the tradeoff between converter speed and accuracy can be somewhat relieved through the use of parallel-connected DAC's. Parallel connections are established by driving the digital inputs of individual DAC's with the same digital input signal, activating the DAC's simultaneously, and adding the DACs' outputs to produce a combined analog output signal. Assuming that the output noise of each converter exceeds one LSB (Least Significant Bit), the precision of a parallel connection of N identical converters can be increased over the precision of a single converter by approximately $\log_2 N$.

The number of converters cannot be increased indefinitely, however. With each added DAC, cost, space, and especially noise of the overall topology increase. Owing to these diminishing returns, parallel topologies seldom include greater than eight converters. Precision is therefore at most tripled, an improvement that corresponds to fewer than two bits. This improvement is not enough to allow high-speed DAC's to operate at the level of precision that many applications require.

BRIEF SUMMARY OF THE INVENTION

With the foregoing background in mind, it is an object of the invention for a single DAC topology to be both fast and precise.

To achieve the foregoing object, as well as other objectives and advantages, a topology for converting a digital input signal into a corresponding analog output signal includes a plurality of substantially identical DAC stages each having lower resolution than the digital input signal. Bits of the digital input signal are distributed to different DAC stages, and at least one bit of the digital input signal is coupled to greater than one DAC stage. A combining circuit is coupled to the outputs of the DAC stages for generating the analog output signal.

According to one embodiment, the DAC stages each include a multi-bit sigma-delta loop, which enhances precision through inherent noise shaping.

BRIEF DESCRIPTION OF THE SEVERAL VIEWS OF THE DRAWINGS

Additional objects, advantages, and novel features of the invention will become apparent from a consideration of the ensuing description and drawings, in which.

DETAILED DESCRIPTION OF THE INVENTION

Figure 1:
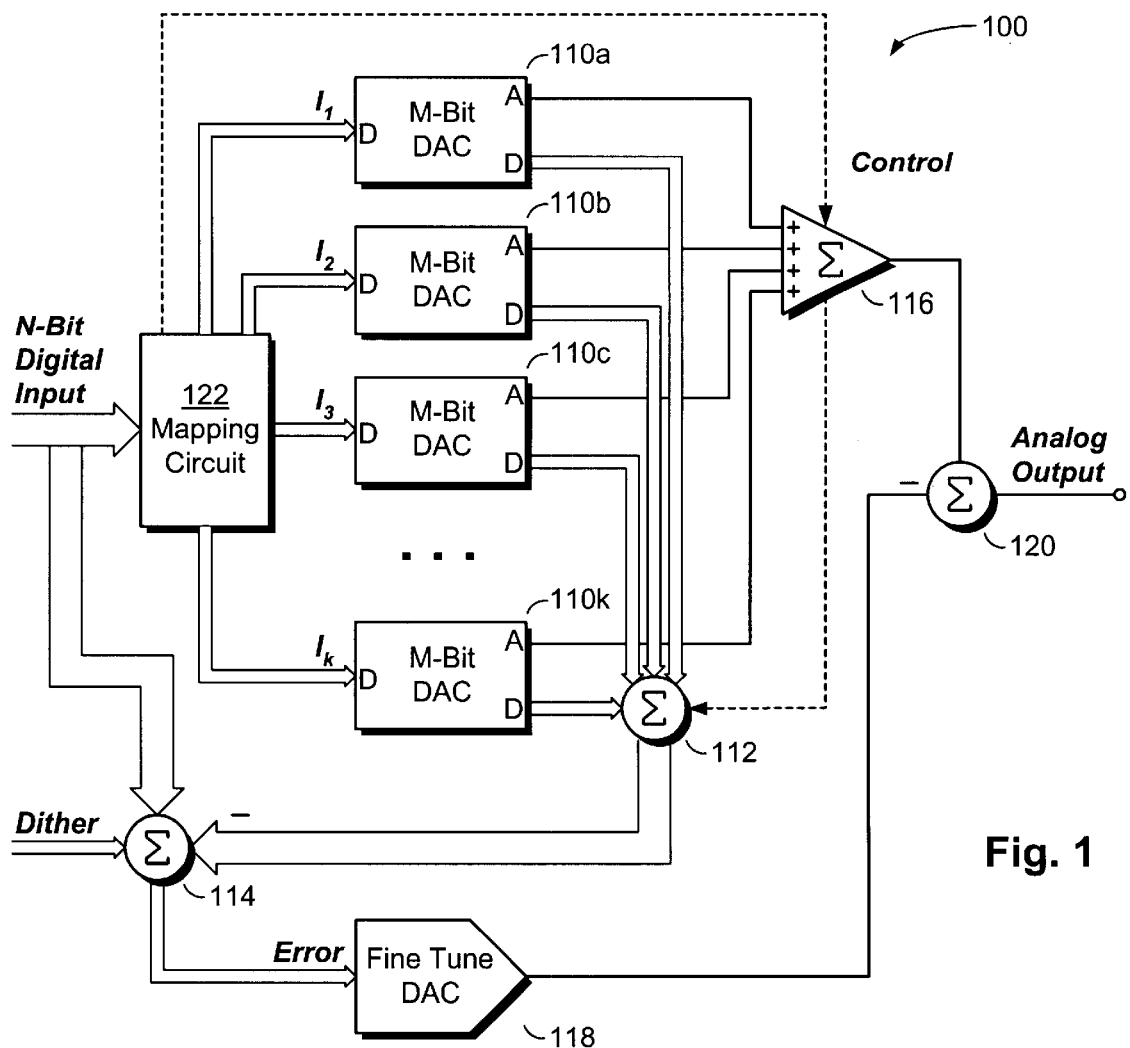
FIG. 1 is a simplified schematic view of a topology according to the invention for converting a digital input signal into an analog output signal.

FIG. 1 shows the preferred embodiment of a converter topology 100 according to the invention. An N-bit digital input signal is applied to a mapping circuit 122, which converts the N-bit digital input signal into a plurality of lower resolution M-bit digital signals (M<N). A plurality of substantially identical M-bit DAC stages, 110a–110k, receive the M-bit digital signals at respective inputs. Each DAC stage generates an analog output signal that corresponds to the M-bit digital signal applied to its input. The DAC stages preferably operate from a common clock (not shown), which causes them to perform their conversions substantially simultaneously. A combining circuit 116 gathers the analog outputs from the DAC stages 110a–110k and sums them together, with appropriate scaling, to generate a combined analog output signal.

Preferably, each DAC stage 110a–110k also generates a digital output signal that represents the analog output signal of the respective DAC stage, in digital format. The topology applies the digital outputs for correcting errors in the analog outputs of the DAC stages. A first summer 112 adds, with appropriate scaling, the digital outputs from the DAC stages 110a–110k. A second summer 114 subtracts the output of the first summer 112 from the N-bit digital input signal, to generate an error signal. A fine tune DAC 118 converts the error signal into analog form, and an analog summer 120 subtracts the analog error signal from the combined analog output signal to generate a corrected signal, "Analog Output." Preferably, dither is added to the input of the fine tune DAC 118, to improve its precision.

Although the resolution of the N-bit digital input signal exceeds the resolution of each of the DAC stages 110a–110k, the resolution N is preferably much smaller than the product M*k, where k is the number of DAC stages. Therefore, at least some of the N bits of the digital input signal (preferably all of them) may be subject to conversion by multiple DAC stages. For the bits that are converted by multiple DAC stages, the topology improves precision in a manner similar to that of the parallel-connected topology of the prior art. In particular, the precision of each repeated bit is improved by approximately $\log_2 R$, where R is the number of different DAC stages to which the bit is connected.

The role of the mapping circuit 122 is to distribute the bits of the N-bit digital input signal among the different DAC stages, to ensure that bits are repeated a sufficient number of times to achieve the desired precision. The mapping circuit 122 can be implemented in a variety of ways. For example, it can employ combinatorial logic for translating input codes of the N-bit digital input signal into input data for each DAC stage. Preferably, however, the mapping circuit comprises a look-up table. The N-bit digital input signal forms an address for accessing data. Data stored at each address of the look-up table encodes digital signals for each of the DAC stages. Preferably, the look-up table specifies data for each and every value of the N-bit digital input signal, i.e., it stores data for $2^N$ different input codes.

The specific manner in which the mapping circuit translates the N-bit digital input signal to the DAC stages cannot be random, but must be done in a manner that allows other portions of the topology 100 to properly construct the analog output signal. In particular, the manner in which the mapping circuit 122 maps bits must be coordinated with the manner in which the combining circuit 116 combines analog outputs. It must also be coordinated with the manner in which the first summer 112 adds digital outputs of the DAC stages, if error correction is to be performed. The help achieve the requisite coordination, the mapping circuit preferably includes control circuitry for generating one or more control signals. The combining circuit 116 and first summing circuit 112 preferably respond to the control signals by reconfiguring themselves to provide appropriate outputs.

To illustrate, consider a simple example in which N=4, M=3, and k=3. Using theses values, the mapping circuit 122 could be arranged to convert input bits to output bit as follows:

TABLE 1

| Input Bits | Output to DAC Stage 1 | Output to DAC Stage 2 | Output to DAC Stage 3 | Sum of Outputs |
|---|---|---|---|---|
| 0000 | 000 | 000 | 000 | 00000 |
| 0001 | 001 | 001 | 001 | 00011 |
| 0010 | 010 | 010 | 010 | 00110 |
| 0011 | 011 | 011 | 011 | 01001 |
| 0100 | 100 | 100 | 100 | 01100 |
| 0101 | 101 | 101 | 101 | 01111 |
| 0110 | 110 | 110 | 110 | 10010 |
| 0111 | 111 | 111 | 111 | 10101 |
| 1000 | 100 | 100 | 000 | 1000 |
| 1001 | 100 | 101 | 000 | 1001 |
| 1010 | 100 | 110 | 000 | 1010 |
| 1011 | 100 | 111 | 000 | 1011 |
| 1100 | 110 | 110 | 000 | 1100 |
| 1101 | 110 | 111 | 000 | 1101 |
| 1110 | 111 | 111 | 000 | 1110 |
| 1111 | 111 | 111 | 001 | 1111 |

Where the MSB of the digital input signal is 0, the mapping circuit 122 simply passes the digital input signal directly to the inputs of the DAC stages. When the MSB is 1, however, the mapping circuit apportions bits among different DAC stages, so that the sum of the inputs to the DAC stages equals the digital input signal.

In this example, it is evident that the combining circuit 116 cannot simply add the analog outputs of the DAC stages to construct the analog output signal. If it did, its output signal would be three times too large for input codes having an MSB of 0. To account for the actions of the mapping circuit 122, the combining circuit 116 varies its gain depending on the value of the MSB, as communicated by the control signal(s). When the MSB is 0, the combining circuit adds the inputs from the DAC stages and effects a relative division by 3. When the MSB is 1, it adds them without division. It is also evident from this example that the first summer 112 cannot simply add digital outputs from the DAC stages the same way for all values of the N-bit digital input signal. It must rather slectively divide the sum by 3 whenever the input MSB is 0, in response to the control signal from the mapping circuit.

In the preferred embodiment, the N-bit digital input signal is 24-bits wide (N=24). There are preferably 6 DAC stages (k=6), each of which has 18-bit resolution (M=18). Although the implementations of the mapping circuit, combining circuit, and summing circuit are more complex with these values than in the simple example provided above, the same general principles apply nevertheless. In the preferred embodiment, the DAC stages deliver their analog outputs in the form of currents. The combining circuit can add their outputs simply by connecting them together at a common electrical node. This node is preferably applied to the input of a conventional current-to-voltage converter, for rendering the combined currents as a voltage. As is known, conventional current-to-include voltage converters include an operational amplifier having a grounded non-inverting input and an inverting input that receives the current to be converted. A resistor is coupled between the output of the operational amplifier and the inverting input for establishing negative feedback and gain. By switching different value resistors into the feedback of the current-to-voltage converter, the gain of the combining circuit can be varied quite simply. The combining circuit 122 preferably includes solid-state switches for rapidly switching different resistors into the feedback of the current-to-voltage converter, to vary its gain on a code-by-code basis, if necessary.

Preferably, the first summer 112 is implemented in software with a processor, such as a DSP (Digital Signal Processing) processor. The processor operates in response to the control signal(s) from the mapping circuit 122 for adding the digital outputs of the DAC stages, for adding them and dividing, or for performing other appropriate operations. Alternatively, the first adder can be implemented with discrete components, such as digital adders and dividers.

Figure 2:
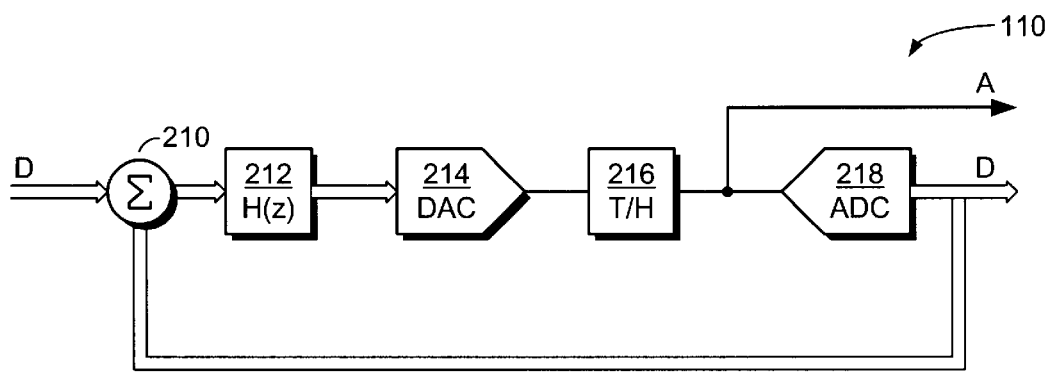
FIG. 2 is a simplified schematic view of a DAC stage used in the topology of FIG. 1.

FIG. 2 shows the preferred embodiment of a DAC stage 110, which is typical of the DAC stages 110a–10k. The DAC stage 110 receives a digital input from one of the outputs of the mapping circuit 122, and generates both an analog output and a digital output. The DAC stage 110 is preferably provided in the form of a single loop, multi-bit sigma-delta converter. The converter includes a summer 210, a loop filter 212, a DAC 214, a track-and-hold 216, and an ADC (analog-to-digital converter) 218. The DAC 214 and ADC 218 are preferably monolithic, high-speed, 18-bit converters. They are preferably integrated on the same chip to provide substantially identical thermal characteristics and gain. The loop filter 212 is preferably an integrator. During the operation of the converter 110, the summer 210 subtracts the output of the ADC 218 from the digital input signal to produce an error signal. The loop filter 212 integrates the error signal over time. Negative feedback drives the output of the ADC 218 to a level that equals the digital input of the DAC stage. In so doing, the negative feedback drives the analog output of the DAC 214 to a value that precisely corresponds to an analog representation of the DAC stage's digital input.

Implementing the DAC stages 110a–110k as sigma-delta loops greatly enhances the precision of the topology 100. As is known, sigma-delta loops provide inherent noise shaping. Although the resolution of the DAC stage 110 is limited to 18-bits, its precision over time greatly exceeds 18-bits due to the tendency of the negative feedback to drive the average of the digital output to the precise value of the digital input. Although the feedback loop generally requires several samples to settle, the loop still maintains high speed due to the high sampling rate and the use of a single feedback loop. Therefore, the multi-bit sigma-delta loops greatly improve precision without unduly impacting speed.

Unlike the direct parallel connection scheme of the prior art, the topology 100 employs relatively low-resolution converters to achieve high speed and low cost. Precision is increased by repeating bits among different DAC stages, and by implementing the DAC stages as multi-bit sigma-delta loops that increase precision though noise shaping.

Alternatives

Having described one embodiment, numerous alternative embodiments or variations can be made. In the example shown in Table 1, the mapping circuit 122 employs a simple mapping algorithm for distributing bits to the different DAC stages 110a–110k. The invention is not limited to this mapping algorithm, however. A wide range of mappings can be used for distributing bits, limited only by the constraint they be substantially reversible in the combining circuit 116. Preferably, for accurate error correction, they should also be substantially reversible in the first summer 112.

As described herein, all the bits of the N-bit digital input signal are repeated approximately the same number of times among the different DAC stages. This can be varied, however. For example, the lower order bits may be repeated more frequently than the higher order bits, or vice-versa.

As described herein, the topology 100 gathers digital outputs from different DAC stages to effect error correction. This is not strictly required, however. Errors can be corrected using other techniques, or not at all, depending upon the particular requirements of the intended application.

Although the DAC stages 110a–110k are preferably implemented as multi-bit sigma-delta loops, the invention is not limited to this design. Accuracy can still be gained while retaining high speed, even without sigma-delta loops. For example, successive-approximation converters or flash converters can be used in place of the sigma-delta loops.

Multi-bit sigma-delta loops sometimes omit the ADC 218, and take their digital feedback directly from the output of the loop filter 212. This and other variations of the sigma-delta loop design can be used, as applications require, within the scope of the invention.

Figure 3:
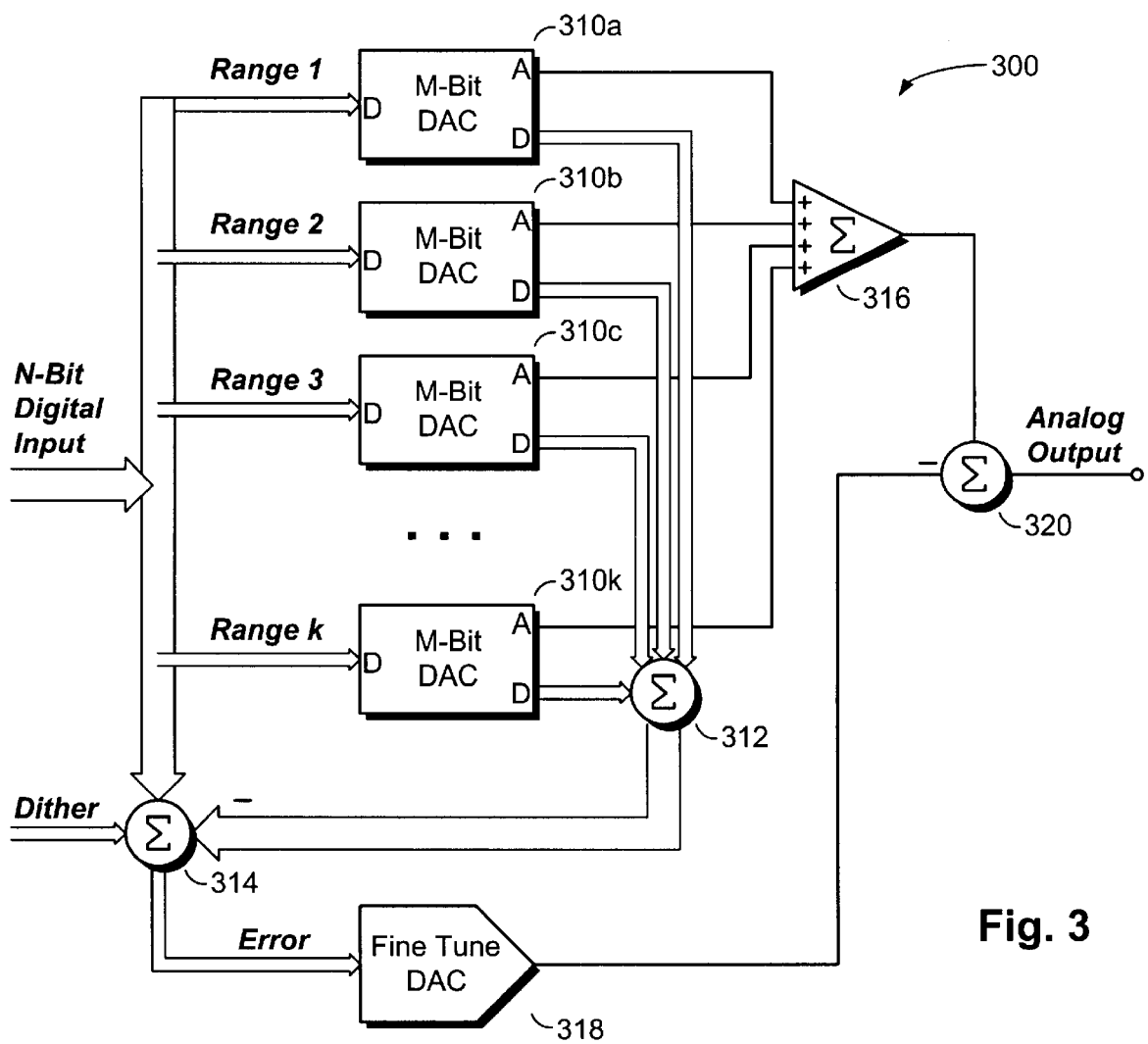
FIG. 3 is a simplified schematic view of a topology according to an alternative embodiment of the invention for converting a digital input signal into an analog output signal.

Yet another variation of the invention is shown in FIG. 3. According to the alternative topology 300, the mapping circuit 122 is omitted altogether. Instead of distributing bits using a mapping circuit, the topology 300 distributes bits directly, by applying different ranges of contiguous bits to different DAC stages. For instance, a first group of DAC stages can receive bits D17–D0 of a 24-bit input signal, and a second group can receive bits D23–D6. The combining circuit 316 directly adds the analog outputs in each group to generate group sums. It then adds the group sums with appropriate scaling. In this example, the combining circuit 316 scales the first group by a relative gain of 1 and the second group by a relative gain of $2^6$. The resulting output of the combining circuit 316 varies in direct proportion with the value of the N-bit digital input signal. If error correction is desired via the first summer 312 and associated circuitry, the first summer 312 preferably normalizes the contribution of the different bits so that each contributes equally to the output of the summer 312.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A topology for converting a digital input signal into an analog output signal, comprising:
   an input port for receiving an N-bit digital input signal;
   an output port for providing an analog output signal that varies in relation with the N-bit digital input signal;
   a plurality of substantially identical M-bit DAC stages, M<N, each DAC stage having a digital input and an analog output, each digital input being coupled to the input port; and
   a combining circuit having a plurality of inputs coupled to the analog outputs of the plurality of DAC stages, and an output coupled to the output port,
   wherein at least one bit of the N-bit digital input signal is coupled to greater than one of the plurality of DAC stages.

2. A topology as recited in claim 1, wherein each bit of the N-bit digital input signal is coupled to greater than one of the plurality of DAC stages.

3. A topology as recited in claim 1, wherein each of the plurality of DAC stages receives at its respective input a contiguous range of bits of the N-bit digital input signal.

4. A topology as recited in claim 3, wherein at least one of the plurality of DAC stages receives a different range of bits of the digital input signal from at least one other of the plurality of DAC stages.

5. A topology as recited in claim 1, wherein each of the plurality of DAC stages generates both an analog output and a digital output indicative of the digital input of the respective DAC stage.

6. A topology as recited in claim 5, wherein each of the plurality of DAC stages comprises a separate sigma-delta loop.

7. A topology as recited in claim 6, wherein the sigma-delta loop of each of the plurality of DAC stages is a first-order sigma-delta loop.

8. A topology as recited in claim 6, wherein the sigma-delta loop of each of the plurality of DAC stages comprises:
   a summer having a first input coupled to the digital input of the DAC stage, a second input receiving a feedback signal, and an output providing a difference between the digital input of the DAC stage and the feedback signal;
   a loop filter having an input and an output, the input coupled to the output of the summer; and
   a DAC circuit having an input and an output, the input coupled to the output of the loop filter.

9. A topology as recited in claim 8, wherein the sigma-delta loop of each of the plurality of DAC stages further comprises:
   a track-and-hold amplifier having an input coupled to the output of the DAC circuit and an output coupled to the analog output of the DAC stage; and
   an analog-to-digital converter circuit having an input coupled to the output of the track-and-hold amplifier and an output providing the feedback signal.

10. A topology as recited in claim 1, wherein the combining circuit comprises at least one summing circuit for generating a weighted sum of signals from the analog outputs of the plurality of DAC stages.

11. A topology as recited in claim 5, further comprising:
   a first digital summer for adding signals from the digital outputs of the plurality of DAC stages to generate an output signal;
   a second digital summer for subtracting the output signal of the first digital summer from the N-bit digital input signal, to generate an error signal;
   a fine tune DAC for providing an analog representation of the error signal; and
   an analog summer for generating a corrected analog output signal proportional to a difference between the output of the combining circuit and the output of the fine tune DAC.

12. A topology as recited in claim 11, wherein dither is added to the input to the fine tune DAC.

13. A topology as recited in claim 1, further comprising:
   a mapping circuit having an input coupled to the input port for receiving the N-bit digital input signal, and a plurality of digital outputs each coupled to the digital input of a different one of the plurality of DAC stages,
   wherein the mapping circuit translates digital codes of the N-bit digital input signal into input codes for each of the plurality of DAC stages.

14. A topology as recited in claim 13, wherein the mapping circuit provides each bit of the N-bit digital input signal to greater than one of the plurality of DAC stages.

15. A topology as recited in claim 14, wherein the mapping circuit comprises a look-up table for translating codes of the N-bit digital input signal into input codes for each of the plurality of DAC stages.

16. A topology for converting a digital input signal into a corresponding analog output signal, comprising:
   a plurality of substantially identical DAC stages, each DAC stage having an input and an output, the input receiving a subset of the bits of the N-bit digital input signal; and
   a combining circuit having a plurality of inputs coupled to the analog outputs of the plurality of DAC stages, for generating the analog output signal,
   wherein at least one bit of the N-bit digital input signal is coupled to greater than one of the plurality of DAC stages.

17. A topology as recited in claim 16, wherein the combining circuit comprises at least one summing circuit for generating a weighted sum of signals from the analog outputs of the plurality of DAC stages.

18. A topology as recited in claim 16, wherein each of the plurality of DAC stages receives a contiguous range of the bits of the N-bit digital input signal, and at least one of the plurality of DAC stages receives a different range of bits of the digital input signal from at least one other of the plurality of DAC stages.

19. A topology for converting a digital input signal into an analog output signal, comprising:
   an input port for receiving an N-bit digital input signal;
   an output port for providing an analog output signal that varies in relation with the N-bit digital input signal;
   a digital mapping circuit having a digital input coupled to the input port and a plurality of different digital outputs;
   a plurality of substantially identical M-bit DAC stages, M<N, each DAC stage having a digital input and an analog output, each digital input being coupled a different digital output of the digital mapping circuit; and
   a combining circuit having a plurality of inputs coupled to the analog outputs of the plurality of DAC stages, and an output coupled to the analog output port,
   wherein at least one bit of the N-bit digital input signal is coupled to greater than one of the plurality of DAC stages.

20. A method for converting an N-bit digital input signal into a corresponding analog output signal, comprising:
   providing different subsets of bits of the N-bit digital input signal to a plurality of substantially identical M-bit DAC stages, M<N;
   actuating each of the plurality of DAC stages to convert its respective input signal into respective output signal; and
   combining the respective output signals to generate the analog output signal,
   wherein at least one bit of the N-bit digital input signal is coupled to greater than one of the plurality of DAC stages.

21. A method of converting an N-bit digital input signal into a corresponding analog output signal, comprising:
   mapping the N-bit digital input signal into a plurality of digital output signals,
   providing each of the plurality of digital output signals to a different one of a plurality of substantially identical M-bit DAC stages, M<N;
   actuating each of the plurality of DAC stages to convert its respective input signal into respective output signal; and
   combining the respective output signals to generate the analog output signal,
   wherein at least one bit of the N-bit digital input signal is coupled to greater than one of the plurality of DAC stages.

* * * * *